United States Patent
Tailliet

[19]

[11] Patent Number: 6,157,243
[45] Date of Patent: Dec. 5, 2000

[54] DEVICE AND METHOD FOR GENERATING A HIGH VOLTAGE

[75] Inventor: François Tailliet, Le Tholonet, France

[73] Assignee: STMicroelectronics S.A., Gentilly, France

[21] Appl. No.: 09/371,549

[22] Filed: Aug. 10, 1999

[30] Foreign Application Priority Data

Aug. 11, 1998 [FR] France ................................. 98 10308

[51] Int. Cl.⁷ ...................................................... G05F 1/10
[52] U.S. Cl. ............................................................ 327/536
[58] Field of Search .............................. 365/226, 189.09; 363/60; 327/534, 535, 536

[56] References Cited

U.S. PATENT DOCUMENTS

| | | | |
|---|---|---|---|
| 5,247,208 | 9/1993 | Nakayama | 327/534 |
| 5,276,646 | 1/1994 | Kim et al. | |
| 5,483,434 | 1/1996 | Seesink | 363/60 |
| 5,978,268 | 11/1999 | Zink et al. | 365/226 |

FOREIGN PATENT DOCUMENTS 0 856 935 A2  8/1998  European Pat. Off. .

OTHER PUBLICATIONS

Patent Proposal, entitled "Charge Pump Triangular Phase", authored by François Tailliet, dated Apr. 7, 1998.
French Search Report dated May 3, 1999, with annex on French Application No. 98–10308.

*Primary Examiner*—Trong Phan
*Attorney, Agent, or Firm*—Theodore E. Galanthay; Stephen C. Bongini; Fleit, Kain, Gibbons, Gutman & Bongini P.L.

[57] ABSTRACT

A device for generating a high voltage includes a charge pump device that outputs a high voltage, an oscillator that supplies at least one clock signal to the charge pump device, and a regulation device. The regulation device generates a control signal to selectively stop the charge pump device based on the level of the high voltage output by the charge pump device. Additionally, the oscillator includes a shaping circuit for shaping the clock signal into a saw-tooth waveform. In a preferred embodiment, the oscillator supplies at least two clock signals to the charge pump device, and each of the clock signals has a saw-tooth waveform. A method for generating a high voltage in an integrated circuit is also provided. According to the method, at least one clock signal is generated, and the clock signal is shaped into a saw-tooth waveform. The shaped clock signal is used to generate a high voltage, and the generation of the high voltage is selectively stopped based on the level of the high voltage. In one preferred method, at least two clock signals are generated, and each of the generated clock signals is shaped in to a saw-tooth waveform.

14 Claims, 5 Drawing Sheets

DEVICE AND METHOD FOR GENERATING A HIGH VOLTAGE

CROSS-REFERENCE TO RELATED APPLICATIONS

This application is based upon and claims priority from prior French Patent Application No. 98-10308, filed Aug. 11, 1998, the entire disclosure of which is herein incorporated by reference.

BACKGROUND OF THE INVENTION

1. Field of the Invention

The present invention relates to electronic circuits, and more specifically to a device for generating a high voltage using a charge pump.

2. Description of Related Art

Non-volatile memories of the EEPROM and Flash EPROM type use a high voltage for their programming. This high voltage is generally in the range of 10 to 20 volts. In an integrated circuit, this high voltage is produced from the supply voltage of the integrated circuit using a high voltage generation device having a charge pump device. The high voltage generation device also includes a device for regulating the output voltage level to obtain a level that is determined as a function of the application.

The regulation can be done by a clamping device located at the output of the charge pump device. However, such a clamping device has a few drawbacks. First, a great deal of energy is lost due to the power dissipated by the clamping device. The clamping device must also be capable of supporting a dissipation of this kind (i.e., it must be sufficiently sized, and therefore fairly costly). Furthermore, since clamping is involved, the charge pump works all of the time. This results in an additional loss of energy.

Another conventional regulation device consists of a circuit for comparing the voltage level at the output of the charge pump device with the level of a reference voltage. If the output level is higher than the reference level, the charge pump is stopped. This type of regulation of the charge pump device is called the "go-no-go" mode of regulation. The major advantage of this type of comparator-based regulation is the high efficiency of the charge pump device, which arises out of the fact that it does not work all of the time.

When the high voltage is not being used, it is reactivated from time to time to maintain the output level at the reference level. It is also reactivated when the programming voltage is used, to maintain the output level despite the load that is then applied to it (i.e., for the programming of memory cells). The energy consumption is therefore near the optimum. However, with such regulation, the level obtained at the output of the charge pump device is not perfectly stable. More specifically, the output level oscillates around the reference value as will now be explained with reference to the conventional device for generating a high voltage shown in FIG. 1.

The high voltage generation device includes an oscillator 10 that outputs two clock signals $\Phi0$ and $/\Phi0$ in phase opposition that are used by a charge pump device 20. This charge pump device 20 outputs a high voltage HV. This high voltage is used, for example, by circuitry 40 for programming or erasing a non-volatile memory. This high voltage HV is also supplied to a regulation device 30 that outputs a control signal Run. This control signal Run is supplied to an enabling input En of the oscillator.

FIG. 2 shows an embodiment of such a high voltage regulation device. A typical oscillator consists of a loop of an odd number of inverters. The oscillator 10 of FIG. 2 conventionally has a stage for generating a clock signal $\Phi i$ that includes, in the illustrated embodiment, an inverter 11 followed in series by a resistor 12 and a Schmitt trigger 13. At the input of the Schmitt trigger 13, there is provided a capacitor 14 that is also connected to ground. The output S1 of the Schmitt trigger is looped to the input E1 of the inverter 11 through a NAND-type logic gate 15.

At another input, this logic gate receives the control signal Run that is supplied to the enabling input En of the oscillator. The input E1 of the inverter 11 gives the clock signal $\Phi i$. This clock signal is supplied to the input of an output stage that delivers the two clock signals $\Phi0$ and $/\Phi0$ in phase opposition to the charge pump device 20. The clock signal $\Phi i$ is supplied to a first inverter 16 followed in series by a second inverter 17. In the illustrated embodiment, the output of the first inverter 16 delivers the clock signal $/\Phi0$ and the output of the second inverter 17 delivers the clock signal $\Phi0$.

The charge pump device in the illustrated embodiment is a Schenkel-type multiplier having n+1 series-connected diodes D0 to Dn, with the first diode having its anode connected to Vcc and the last diode giving the high voltage HV for output. An output capacitor Cout is provided between the high voltage output HV and ground. The multiplier also has n capacitors C1 to Cn that are controlled by the clock signals $\Phi0$ and $/\Phi0$. Each capacitor has a first terminal connected between two successive diodes and a second terminal connected to one of the clock signals. In the illustrated embodiment, the capacitors C1, C3, . . . Cn have their terminals connected to the clock signal $\Phi0$ while the capacitors C2, . . . Cn-1 have their terminals connected to the clock signal in phase opposition $/\Phi0$. This charge transfer or charge-coupled device is very widely used.

In the illustrated embodiment, the regulation device 30 includes a Zener diode 31 and a resistor 32 series-connected between the high voltage output HV of the charge pump device 20 and ground. An inverter 33, whose input is connected to a connection point 34 (i.e., the midpoint of the arm of the regulation device) between the diode 31 and the resistor 32, outputs the control signal Run. The diode 31 has a Zener voltage illustratively equal to 18 volts. It is this Zener voltage which gives the reference voltage level Ref for the regulation device.

When the high voltage HV exceeds this reference level of 18 volts, the current in the diode increases and the voltage at the midpoint tends to rise (i.e., because the voltage at the terminals of the Zener diode remains constant). At the output of the inverter 33 of the regulation device 30, the signal Run therefore goes to 0. This deactivates the oscillator 10. When the high voltage HV is lower than the reference level, the current in the arm of the regulation device is very low and the voltage at the midpoint 34 is close to zero. The signal Run then goes to 1. This activates the oscillator.

The signals in such a device for generating a high voltage are shown in FIG. 3. This figure shows the progress as a function of time of the clock signals $\Phi0$ and $/\Phi0$, the control signal Run, and the high voltage signal HV at the output of the charge pump device, starting from the powering off of the high voltage generation device. As shown, there is a gradual build-up of the output level HV of the charge pump device until the crossing of the reference level Ref of the regulation device. So long as the high voltage has not reached the reference level Ref, the control signal Run remains at 1. Thus, the oscillator remains active and outputs the clock signals $\Phi0$ and $/\Phi0$.

When the output level HV crosses the reference level Ref, the regulation device detects this and deactivates the oscillator (i.e., through control signal Run). As shown in FIG. 3, this deactivation corresponds to the freezing of the clock signals Φ0 and /Φ0, which remain in a given state. For the illustrated embodiment, FIG. 3 shows that at the first occurrence where the signal Run goes to zero, Φ0 remains at the high level and /Φ0 remains at the zero level. The charge pump device therefore no longer operates. The level of the output voltage HV will then gradually fall, either because of current leakages or because of the activation of a circuit for programming the memory (i.e., a load).

The output voltage level will therefore go back to below the reference level Ref. The oscillator is then reactivated, and the output level of the charge pump device will rise again. Thus, when the regulation device has determined that the level of the high voltage HV is greater than the reference level, the oscillator is deactivated. However, this deactivation occurs only after the reaction time of the regulation circuit. It is quite possible during this period of time to have had a trailing edge and/or a leading edge on the clock signals Φ0 and /Φ0. Since the pulses of these clock signals are square-wave pulses (i.e., since they have very steep edges), the amplitude variation on these clock signals is instantaneous.

Furthermore, the clock signals are only frozen by the deactivation of the oscillator (i.e., they each remain at a high level or at a low level). The transfer of charges to the charge pump device is therefore not immediately stopped. The output voltage therefore continues to rise for a certain time, and crosses the reference level. This results in the oscillation of the amplitude of the level of the output voltage. Since the stopping of the pump is not immediate, the distance from the reference value becomes slightly greater.

To reduce this oscillation, bringing the phase signals to zero does not suffice to prevent a transfer of charges during the reaction time of the regulation device. As described above, since the leading edges of the (square-wave) pulses of the clock signals are very steep, when the level HV at the output of the charge pump device reaches the reference level Ref, the phase signals reach their maximum amplitude before the regulation device has been able to react. Thus, even if the phase signals are then brought to zero, the charge transfer will have continued during the reaction time of the regulation device, and the output level will have greatly exceeded the reference level.

SUMMARY OF THE INVENTION

In view of these drawbacks, it is an object of the present invention to overcome the above-mentioned drawbacks and to provide a high voltage generation device in which the transfer of charges in a charge pump device is limited during the reaction time of a regulation device. Saw-tooth shaped clock signals are provided to the charge pump device. Since the saw-tooth shaped waveform of pulses has a voltage build-up along a ramp, the output voltage of the pump can only vary slowly, and preferably slowly enough for the reaction time of the regulation device to become negligible. In preferred embodiments, the saw-tooth shaped waveform of the clock pulses causes a voltage build-up of the output of the charge pump device that is slow enough so that when the reference level is reached by the output, the additional charge transfer due to the reaction time of the regulation device is negligible.

One embodiment of the present invention provides a device for generating a high voltage. The device includes a charge pump device that outputs a high voltage, an oscillator that supplies at least one clock signal to the charge pump device, and a regulation device. The regulation device generates a control signal to selectively stop the charge pump device based on the level of the high voltage output by the charge pump device. Additionally, the oscillator includes a shaping circuit for shaping the clock signal into a saw-tooth waveform. In a preferred embodiment, the oscillator supplies at least two clock signals to the charge pump device, and each of the clock signals has a saw-tooth waveform.

Another embodiment of the present invention provides a method for generating a high voltage in an integrated circuit. According to the method, at least one clock signal is generated, and the clock signal is shaped into a saw-tooth waveform. The shaped clock signal is used to generate a high voltage, and the generation of the high voltage is selectively stopped based on the level of the high voltage. In one preferred method, at least two clock signals are generated, and each of the generated clock signals is shaped in to a saw-tooth waveform.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
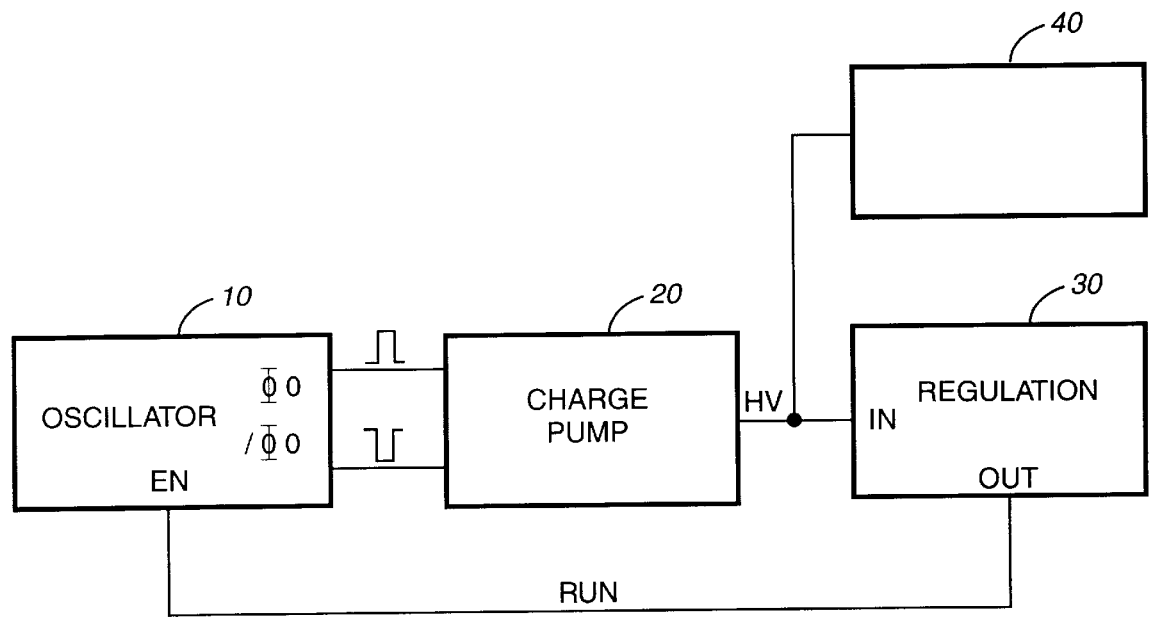
FIG. 1 is a block diagram of a conventional high voltage generation device.

Preferred embodiments of the present invention will be described in detail hereinbelow with reference to the attached drawings. In the different figures, elements that are the same bear the same reference numerals and duplicate descriptions thereof are omitted.

Figure 2:
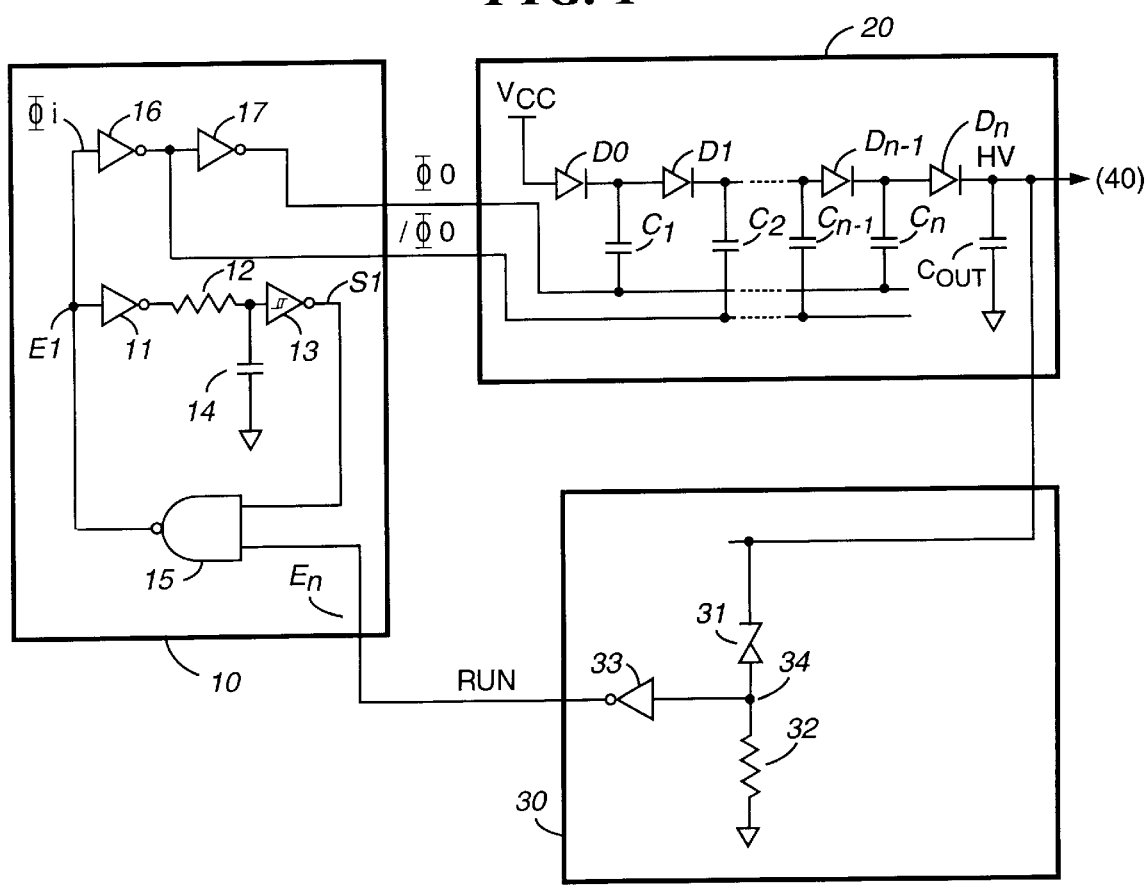
FIG. 2 is a detailed drawing of an embodiment of the device of FIG. 1.
Figure 4:
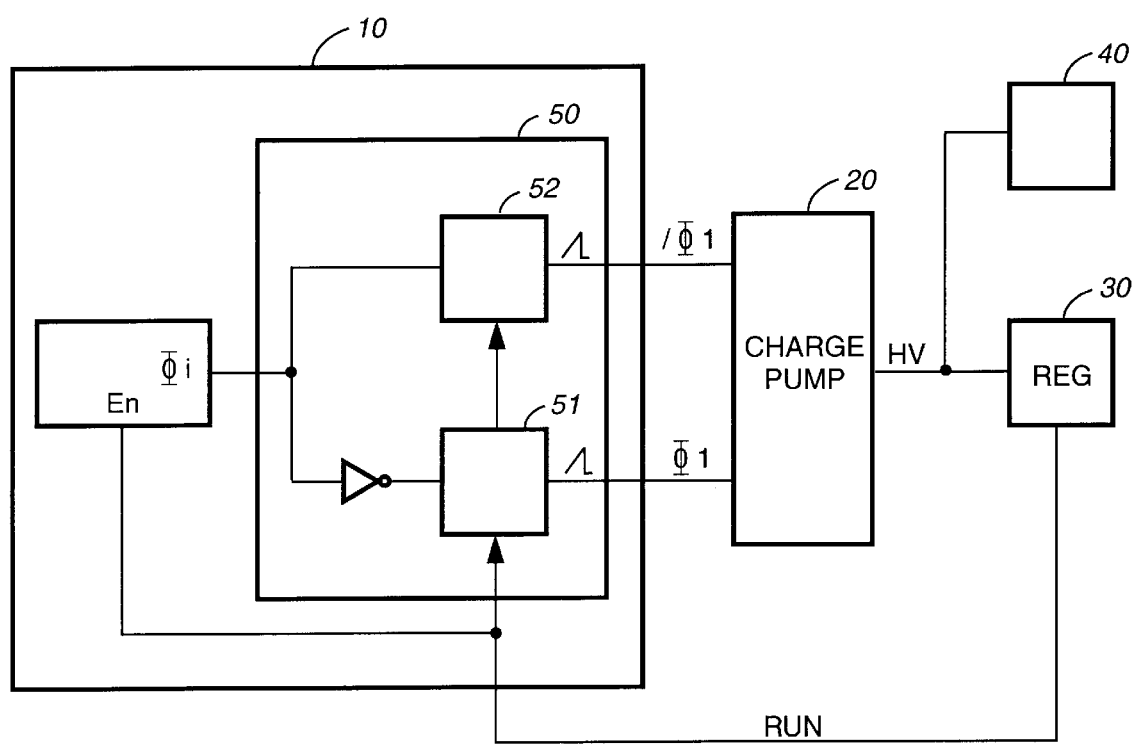
FIG. 4 is a block diagram of a high voltage generation device according to a preferred embodiment of the present invention.

FIG. 4 is a block diagram of a high voltage generation device according to a preferred embodiment of the present invention. In this generation device, the oscillator 10 has a shaping circuit 50 for shaping the pulses of the clock signals for the charge pump 20 into a saw-tooth waveform. Thus, the leading edge of the pulses applied to the charge pump device follows a voltage ramp. In this illustrative embodiment, two clock signals in phase opposition are supplied to the charge pump device. The saw-tooth shaping circuit 50 replaces the output stage of the conventional device of FIG. 2, which has two inverters 16 and 17. This shaping circuit 50 outputs clock signals Φ1 and /Φ1 with a saw-tooth waveform.

Figure 5:
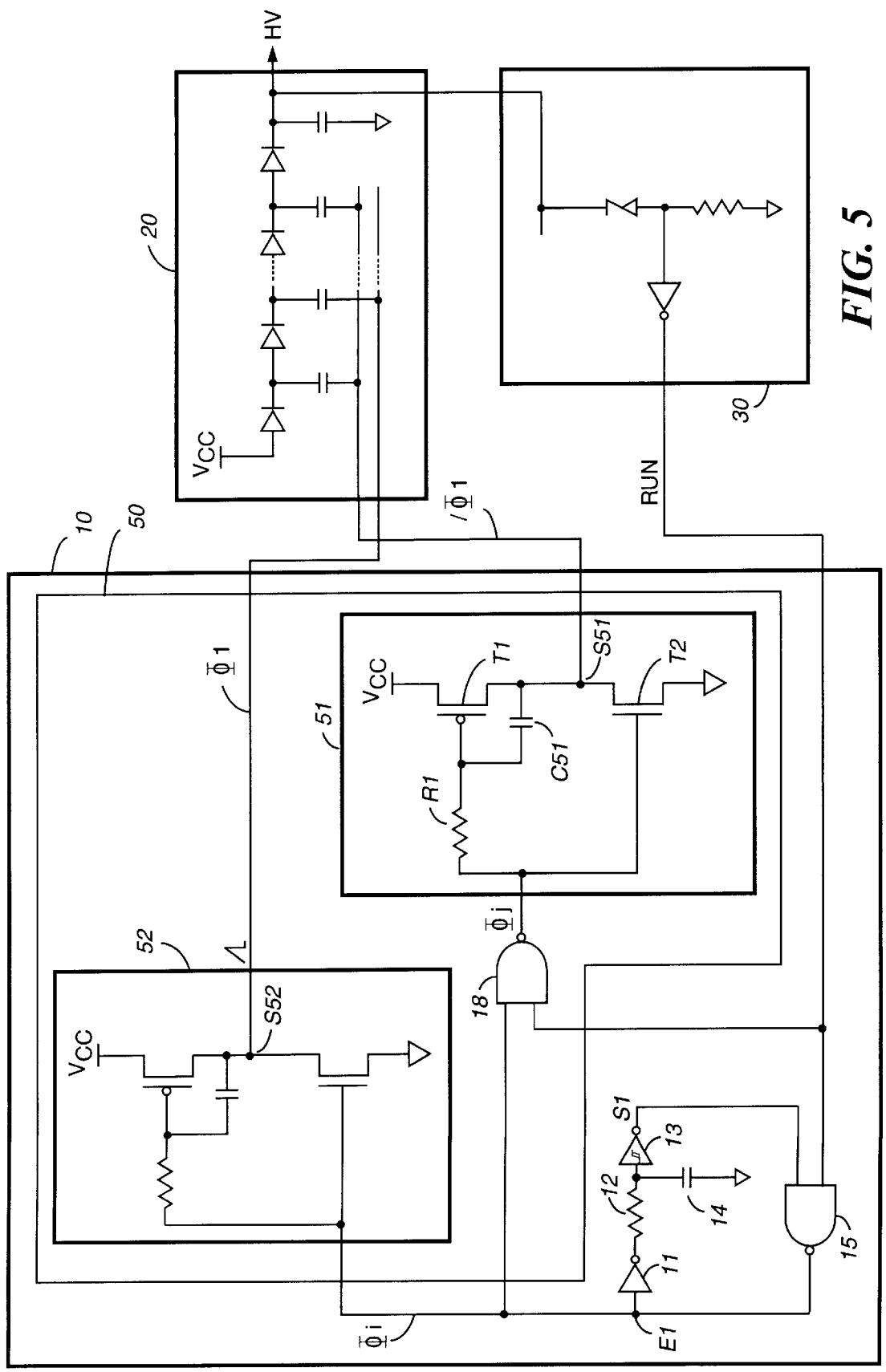
FIG. 5 is a detailed drawing of one embodiment of the device of FIG. 4.

In the preferred embodiment of FIG. 4, the clock signal shaping circuit 50 includes one ramp generator per clock signal to be delivered. Because two clock signals in phase opposition have to be output, there is thus a first ramp generator 51 and a second ramp generator 52 in this embodiment. These generators are controlled by the clock signal Φi from node E1 of the oscillator (i.e., at the input of the inverter 11, as shown in FIG. 5). The first and second generators respectively output first and second converted clock signals Φ1 and /Φ1, which are supplied to the input of the charge pump device 20. Preferably, as shown in FIG. 4, the control signal Run is supplied to each of the ramp generators to command the return to zero of the clock signals Φ1 and /Φ1 as fast as possible when the control signal Run goes to zero.

FIG. 5 is a detailed drawing of one embodiment of the present invention. The ramp generators 51 and 52 shown in FIG. 5 represent only one exemplary embodiment of the present invention, and are not meant to be limiting. As shown, the clock signal Φi available at node E1 of the oscillator is supplied directly to the input of the second ramp generator 52 which gives the second converted clock signal /Φ1. This signal Φi is also supplied to the input of the first ramp generator 51 through an inverting gate 18. In the illustrated embodiment, the inverting gate is a NAND-type gate with two inputs, one input for the clock signal Φi and another input for the enabling signal Run. This inverting gate 18 outputs a signal Φj, which is supplied to the input of the first ramp generator 51. The first ramp generator 51 gives the first converted clock signal Φ1.

The ramp generators 51 and 52 are identical. Each includes two MOS transistors T1 and T2 that are series-connected between the supply voltage Vcc and ground. In the illustrated example, transistor T1 is a P-type transistor and transistor T2 is an N-type transistor. The source of transistor T1 is connected to the supply voltage Vcc and its drain is connected to the drain of transistor T2. The source of transistor T2 is connected to ground. The output Φj of the NAND gate 18 is supplied to the gate of transistor T1 through a resistor R1, and is also directly supplied to the gate of transistor T2. A capacitor C51 is connected between the gate and drain of transistor T1. The connection point S51 between the drains of transistors T1 and T2 is the output node of the ramp generator. This output S51 (for the first ramp generator 51) gives the first converted clock signal Φ1. The second ramp generator 52 has the same constitution. It receives the signal Φi from node E1. The output node S52 of the second ramp generator 52 produces the second converted clock signal /Φ1.

The working of the ramp generators 51 and 52 is as follows. With reference to the first ramp generator 51, when the signal Φj is at 0, transistor T1 is on and transistor T2 is off. The capacitor gets charged by a constant current. The voltage at the output node S51 grows linearly. When the signal Φj goes to 1, transistor T1 goes off while transistor T2 comes on and gets saturated. It discharges the capacitor. The output node S51 is therefore drawn to zero. The transistor T2 is sized so that the discharge is particularly fast.

Figure 6:
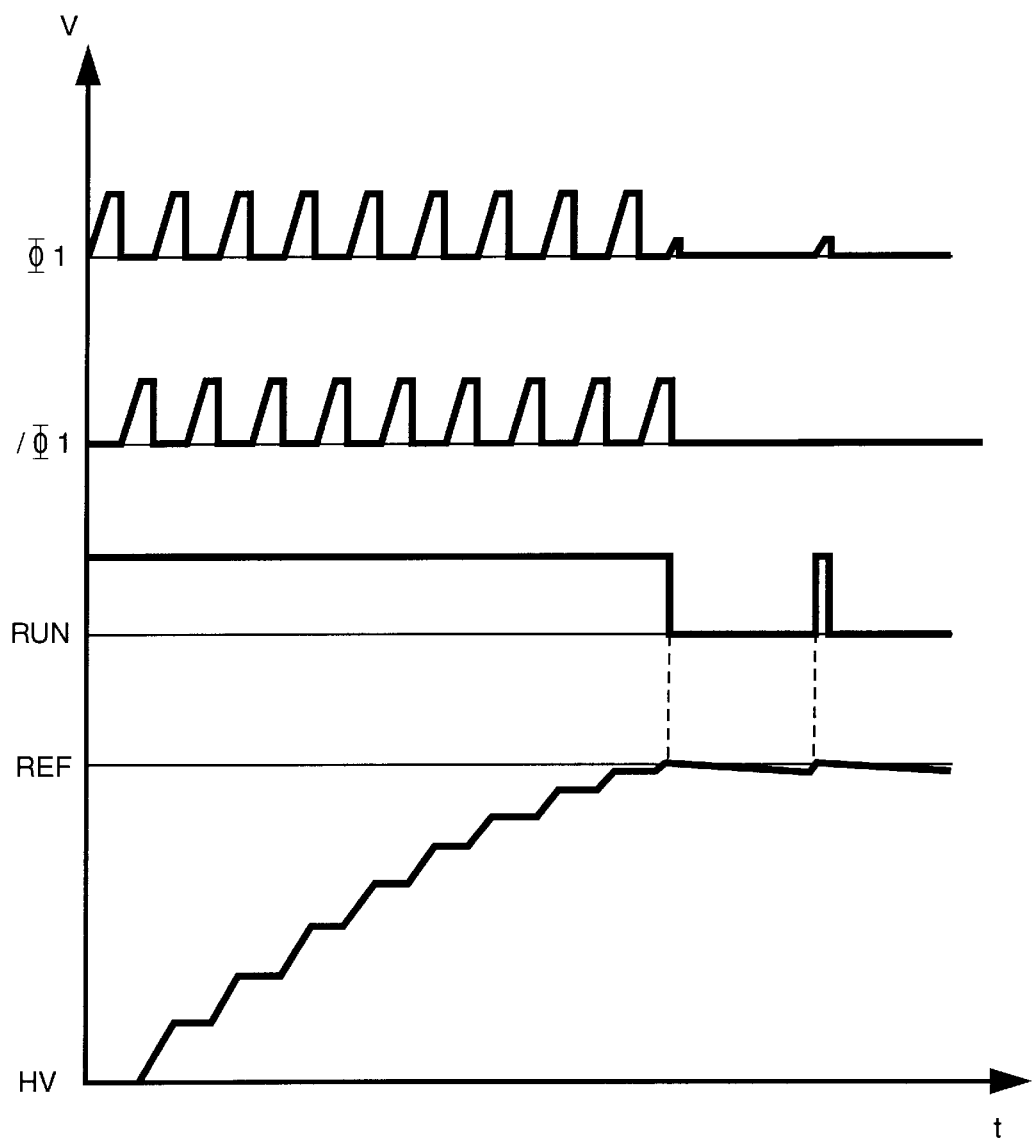
FIG. 6 is a timing diagram for signals in the device of FIG. 5.

FIG. 6 shows the signals from the circuit of FIG. 5. As shown, the saw-tooth shaped waveform of pulses of the clock signals Φ1 and /Φ1 control the charge pump device. For each pulse, there is a voltage build-up along a ramp followed by a very steep descent. When the enabling signal Run goes to zero, the clock signal Φ1 is stopped in its voltage build-up and brought to zero. Thus, owing to the saw-tooth shaped waveform of the clock pulses used in the charge pump device, the level of the high voltage HV does not have time to rise much above the reference level during the reaction time of the regulation device.

It will be noted that an inverter could simply have been used as the inverting logic gate 18 at the input of the first ramp generator 51. (FIG. 4 actually shows an inverter at the input of the first ramp generator 51.) However, in the embodiment of FIG. 5, a NAND logic gate is used at the input of the first ramp generator 51 to make it possible to apply the control signal Run thereto so as to bring the clock signal Φ1 to zero as soon as the control signal Run goes to zero, without using the signal Φi. In this way, the reaction time is the same as it is for the second ramp generator 52. In both cases (i.e., for each generator), only one logic gate is used to apply the control signal Run (i.e., gate 15 for generator 52 and gate 18 for generator 51).

Figure 3:
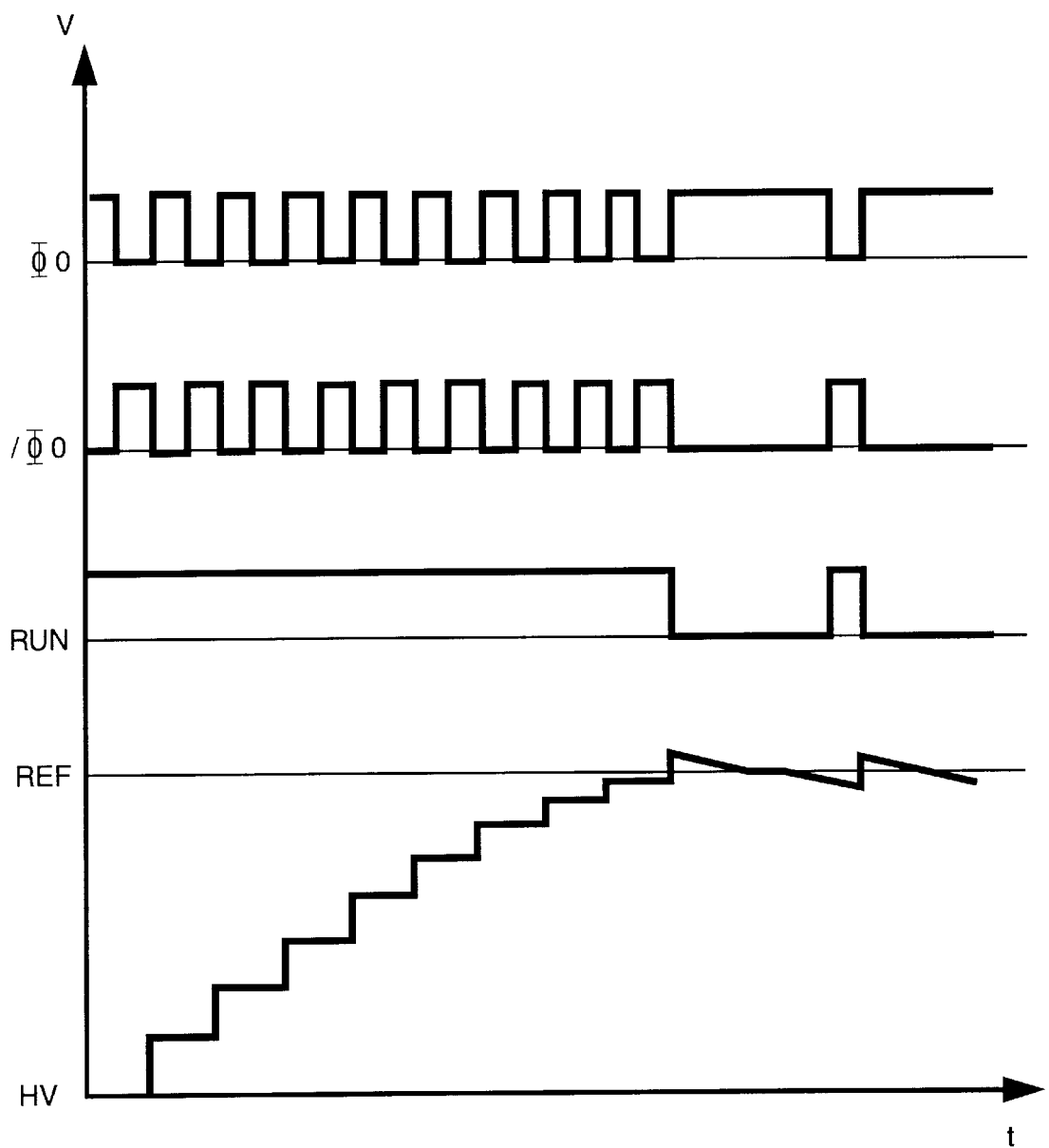
FIG. 3 is a timing diagram for signals in the device of FIG. 2.

In accordance with the present invention, a saw-tooth shaped waveform of pulses is supplied to the charge pump device to make it possible to obtain a very small amplitude variation in the level of the high voltage HV that is output, as shown in FIG. 6. In comparison to the variation of the high voltage in the conventional device that uses the typical square-wave pulses shown in FIG. 3, the high voltage obtained through the device of the present invention (as shown in this FIG. 6) is clearly advantageous. The high voltage generation device of the present invention is particularly suited for use in non-volatile memory devices.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A device for generating a high voltage, said device comprising:

a charge pump device outputting a high voltage;

an oscillator outputting at least one clock signal that is supplied to the charge pump device; and a regulation device generating a control signal to selectively stop the charge pump device based on the level of the high voltage output by the charge pump device, wherein the oscillator includes a shaping circuit for shaping the clock signal output by the oscillator into a saw-tooth waveform.

2. The device as defined in claim 1, wherein the regulation device supplies the control signal to the oscillator.

3. The device as defined in claim 2, wherein the oscillator selectively stops the clock signal based on the control signal from the regulation device.

4. The device as defined in claim 3, wherein when the clock signal is stopped, it is returned to zero level.

5. The device as defined in claim 1, wherein the regulation device generates the control signal based on a comparison of the level of the high voltage output by the charge pump device with a reference level.

6. The device as defined in claim 1, wherein the oscillator outputs at least two clock signals that are supplied to the charge pump device, each of the clock signals output by the oscillator having a saw-tooth waveform.

7. The device as defined in claim 6, wherein the shaping circuit includes one voltage ramp generator for each of the clock signals output by the oscillator.

8. The device as defined in claim 7,
wherein the oscillator selectively returns all of the clock signals to zero level based on the control signal from the regulation device, and
the control signal is supplied to each of the ramp generators through a logic gate in order to control the return of the clock signals to the zero level.

9. A method for generating a high voltage in an integrated circuit, said method comprising the steps of:
generating at least one clock signal within an oscillator;
shaping the generated clock signal into a saw-tooth waveform that is output by the oscillator;
supplying the shaped clock signal output by the oscillator to a device that generates a high voltage; and
selectively stopping the generation of the high voltage based on the level of the high voltage.

10. The method as defined in claim 9, wherein the step of selectively stopping the generation of the high voltage includes the sub-step of selectively stopping the generation of the clock signal.

11. The method as defined in claim 10, wherein in the sub-step of selectively stopping the generation of the clock signal, the clock signal is returned to zero level.

12. The method as defined in claim 9, wherein the step of selectively stopping the generation of the high voltage includes the sub-step of comparing the level of the high voltage with a reference level.

13. The method as defined in claim 9,
wherein in the generating step, at least two clock signals are generated within the oscillator, and
in the shaping step, each of the generated clock signals is shaped into a saw-tooth waveform that is output by the oscillator.

14. The method as defined in claim 13, wherein the step of selectively stopping includes the sub-step of selectively stopping the generation of the clock signal by returning the clock signal to zero level based on a control signal.

* * * * *